US007242209B2

(12) United States Patent
Roberts et al.

(10) Patent No.: US 7,242,209 B2
(45) Date of Patent: Jul. 10, 2007

(54) SYSTEM AND METHOD FOR TESTING INTEGRATED CIRCUITS

(75) Inventors: Gordon W. Roberts, Montreal (CA); Antonio H. Chan, Brossard (CA); Geoffrey D. Duerden, Montreal (CA); Mohamed M. Hafed, Montreal (CA); Sébastien Laberge, Montreal (CA); Bardia Pishdad, Montreal (CA); Clarence K. L. Tam, Montreal (CA)

(73) Assignee: DFT Microsystems, Inc., Burlington, MA (US)

( * ) Notice: Subject to any disclaimer, the term of this patent is extended or adjusted under 35 U.S.C. 154(b) by 40 days.

(21) Appl. No.: 10/838,846

(22) Filed: May 3, 2004

(65) Prior Publication Data

US 2005/0253617 A1 Nov. 17, 2005

(51) Int. Cl.
*G01R 31/26* (2006.01)
(52) U.S. Cl. ...................................... 324/765
(58) Field of Classification Search ...................... None
See application file for complete search history.

(56) References Cited

U.S. PATENT DOCUMENTS

| | | | | |
|---|---|---|---|---|
| 3,874,072 | A * | 4/1975 | Rose | 438/615 |
| 5,115,402 | A * | 5/1992 | Matsushiro et al. | 345/441 |
| 5,115,407 | A * | 5/1992 | Bird et al. | 324/73.1 |
| 5,126,657 | A * | 6/1992 | Nelson | 324/761 |
| 5,646,521 | A | 7/1997 | Rosenthal et al. | 324/158.1 |
| 6,275,962 | B1 * | 8/2001 | Fuller et al. | 324/527 |
| 6,883,128 | B2 * | 4/2005 | Kang et al. | 714/738 |
| 6,944,837 | B2 * | 9/2005 | Rohrbaugh et al. | 714/724 |
| 6,966,019 | B2 * | 11/2005 | Viens et al. | 714/724 |
| 6,996,757 | B2 * | 2/2006 | Evans | 714/724 |
| 2002/0093359 | A1 * | 7/2002 | Babcock | 324/765 |
| 2002/0118007 | A1 * | 8/2002 | Mori et al. | 324/158.1 |
| 2003/0208713 | A1 | 11/2003 | Evans | 714/742 |
| 2005/0143968 | A9 * | 6/2005 | Odom et al. | 703/21 |

OTHER PUBLICATIONS

Testing of RF, Analog, and Mixed-Signal Circuits for Communications: An Embedded Approach; by Mohamed M. Hafed and Gordon W. Roberts; *Wireless Communications Circuits and Systems*, IEE Press, Stevenage, UK, Ed. Yichuang Sun, May 2003.

(Continued)

*Primary Examiner*—Jermele Hollington
(74) *Attorney, Agent, or Firm*—Downs Rachlin Martin PLLC

(57) ABSTRACT

A module (236, 236') containing an integrated testing system (108) that includes one or more measurement engines (200, 202) tightly coupled with a compute engine (208). The one or more measurement engines include at least one stimulus instrument (212) for exciting circuitry of a device-under-test (104) with one or more stimulus signals, and at least one measurement instrument (216) that measures the response of the device-under-test to the stimulus signal(s) and generates measurement data. The compute engine includes computation logic circuitry (800) for determining whether or not the circuitry aboard the device-under-test passes or fails. The integrated testing system further includes a communications engine (204) providing two-way communications between the integrated testing system automated testing equipment (116) and/or a dedicated user interface (140) residing on a host computer (136).

58 Claims, 8 Drawing Sheets

OTHER PUBLICATIONS

A Jitter Characterization System Using a Component-Invariant Vernier Delay Line by Antonio H. Chan and Gordon W. Roberts; TVLSI-00210-2002; pp. 1-15; Oct. 29, 2002.

A 4-GHz Effective Sample Rate Integrated Test Core for Analog and Mixed-Signal Circuits; by Mohamed M. Hafed, Nazmy Abaskharoun and Gordon W. Roberts; *IEEE Journal of Solid-State Circuits*, vol. 37, No. 4, Apr. 2002.

Test and Evaluation of Multiple Embedded Mixed-Signal Test Cores; by Mohamed Hafed and Gordon W. Roberts; circa 2002.

Techniques for High Frequency Integrated Test and Measurement; by Mohamed Hafed and Gordon W. Roberts; (IM-3452); pp. 1-24; circa 2001.

Internet-Appliance Technology Automates Test Equipment; by Edward F. Steinfeld; www.ednmag.com; pp. 157, 158, 160, 162, 164, 166, 169; Oct. 12, 2000.

*Terabit-per-second Automated Digital Testing*, D.C. Keezer, Q. Zhou, C. Bair, J. Kuan and B. Poole; ITC International Test Conference, Paper 41.3; pp. 1143-1151; 0-7803-7169-0/01 IEEE.

* cited by examiner

SYSTEM AND METHOD FOR TESTING INTEGRATED CIRCUITS

FIELD OF THE INVENTION

The present invention generally relates to the field of integrated circuits. In particular, the present invention is directed to a system and method for testing integrated circuits.

BACKGROUND OF THE INVENTION

Mixed-signal integrated circuits are becoming increasingly prevalent with the continually increasing scale of circuit integration that has spurred the development of system on chip (SOC) design and other types of design integration. Concurrent with increasing integration scale, the operating speeds of circuits has also increased. The increases in both integration scale and speed has raised the complexity and difficulty of testing these circuits and their component circuitry. As a result, design for testability (DFT), built-in self test (BIST) and embedded test core testing schemes have been employed to facilitate testing of these circuits. However, each of these schemes has one or more drawbacks, especially as integration scale and operating speeds continue to increase.

Generally, DFT is a design approach in which integrated circuit designs are partially dictated by testing considerations. Typically, DFT includes providing ready access by automated testing equipment (ATE) to certain portions of the integrated circuits, e.g., by providing externally accessible test pads that allow ATE to communicate with the portion of the circuit being tested. One drawback of DFT is that with increasing speeds, the relatively slow speeds of conventional ATE and the relatively long signal propagation delay attendant the physical distance between the ATE and the circuit under test (CUT) hamper testing. Another drawback is that the manner in which conventional ATE conduct testing reduces testing speeds. For example, conventional ATE may perform a particular test by storing a large amount of measurement data from a particular test and then processing the data after the measurement data has been collected. This sort of testing/processing can result in relatively long testing times, which are undesirable, particularly with high-production circuits.

BIST and embedded testing core schemes are similar to one another in that they require dedicated testing circuits to be added to the integrated circuits. Drawbacks of BIST and embedded testing core schemes include the need to add often-complex testing circuits to the integrated circuits. As levels of integration of SOCs and similar devices increase, the number of additional testing circuits needed likewise increase. Generally, if given a choice, circuit designers would prefer not to utilize valuable chip space for testing circuits.

In view of the foregoing, what are needed, among other things, are a system and method for testing digital/analog integrated circuits, and/or portions of the circuitry thereof, that minimize impact on chip space and minimize testing time, yet are capable of testing high-speed circuits. It is also desirable that, in some embodiments, such a system and method be "backward-compatible" for use with conventional and legacy ATE. The system and method of the present invention satisfy these and other needs.

SUMMARY OF THE INVENTION

In one embodiment, the present invention is directed to an integrated testing system for testing circuitry of a DUT via an interface board having a first socket for receiving the integrated testing system and a second socket for receiving the DUT. The integrated testing system comprises a module operatively configured to engage the first socket of the interface board. The module includes at least one measurement engine operatively configured to electrically excite the circuitry, measure a response of the circuitry and generate measurement data when the integrated testing system is engaged with the first socket and the DUT is engaged with the second socket. The module further includes a compute engine operatively configured to perform at least one computation on said measurement data.

In another embodiment, the present invention is directed to a method of testing circuitry of a DUT. The method comprises the steps of engaging a module containing an integrated testing system with an interface, engaging a DUT with said interface and causing said integrated testing system to conduct a test of circuitry of said DUT.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION OF THE DRAWINGS

Figure 1:
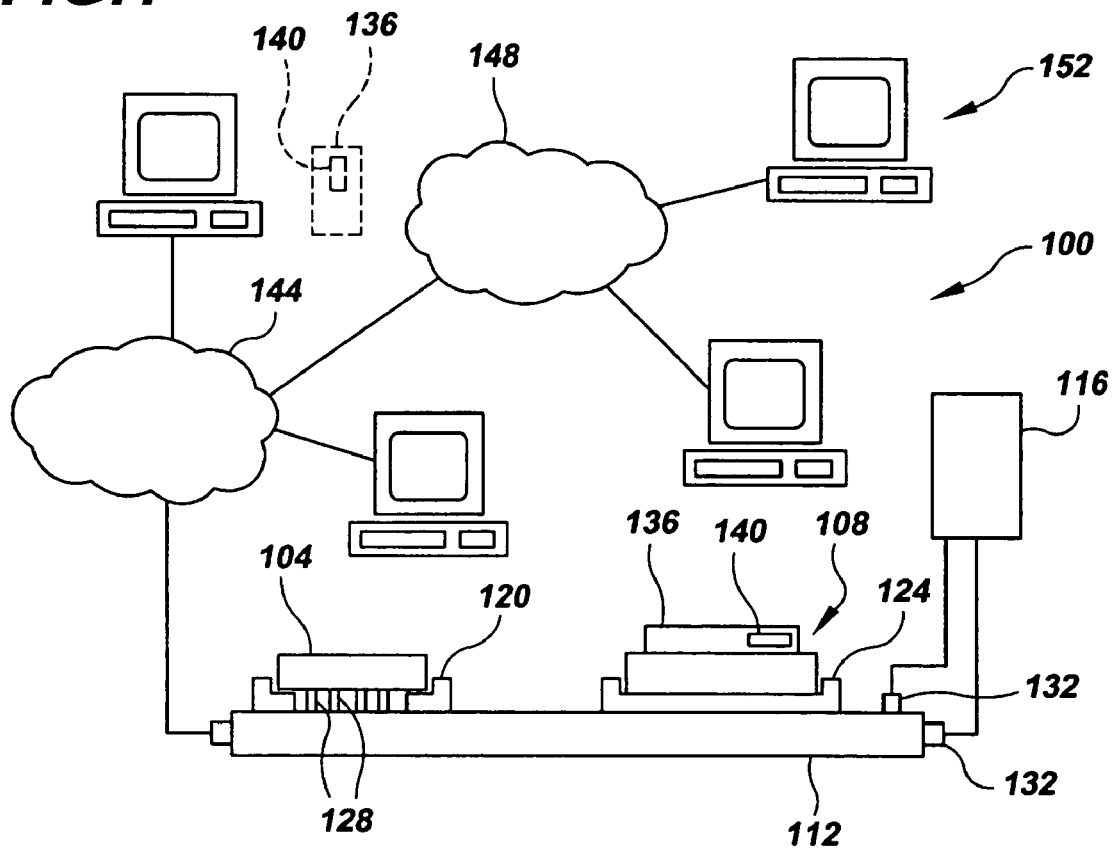
FIG. 1 is a partial high-level schematic diagram/partial side view of a testing setup of the present invention illustrating the testing of a device-under-test.

Referring to the drawings, FIG. 1 shows in accordance with the present invention a testing setup, which is generally denoted by the numeral 100. Testing setup generally includes a device under test (DUT) 104 and an integrated testing system 108 in electrical communication with the DUT via an interface, such as an interface board 112, that provides signal paths between the DUT and the integrated testing system. As those skilled in the art will come to appreciate upon reviewing this entire disclosure, DUT 104 may contain any circuit(s) (not shown) or portions thereof that may be tested using one or more test instruments external to the DUT. Typically, though not necessarily, DUT 104 will be an integrated circuit chip or chip set. The corresponding circuit(s) may be any digital, analog or mixed-signal circuit(s) amenable to electrical performance and/or characterization testing. Those skilled in the art will understand that due to the wide variety of circuitry that may be tested using integrated testing system 108 of the present invention, there is a corresponding wide variety of performance and characterization tests that may be implemented in conjunction with the present invention. Thus, while the present invention is particularly described below in connection with the testing of a serializer/deserializer (SerDes) device (FIG. 3) using jitter performance and characterization testing, it is by no means limited to this one application. Rather, the SerDes implementation is provided to exemplify various features of the invention. Those skilled in the art will readily understand how to apply these features and the broad principles of the present invention to other types of testable circuitry and tests.

Interface board 112, e.g., may be a conventional device interface board (DIB) used in conjunction with ATE 116. Interface board 112 may include one or more DUT sockets 120 for receiving a corresponding number of DUTs (104), as well as one or more tester-support sockets 124 for receiving various testing modules or testing boards, one or more of which may include integrated testing system 108. As used herein and in the appended claims, the term "socket" and like terms are used in a broad sense to denote any structure (s) that are part of, and/or engage, interface board 112 so as to substantially fix integrated testing system 108 relative to the board and electrically connect the integrated testing system to the board. On conventional DIBs, tester-support sockets 124 are generally provided for receiving various modules and/or boards (not shown), such as signal conditioning boards, among others, that support testing via ATE 116. Each DUT socket 120 may include a plurality of electrical connectors/contacts 128, e.g., pogo pins, among others, for electrically connecting the corresponding DUT 104 to interface board 112. Similarly, each tester-support socket 124 may include electrical connectors (not shown), e.g., pin contacts, among others, for electrically connecting the corresponding test module, in this case integrated testing system 108, to interface board 112. Interface board 112 may also include other conventional electronics (not shown) for controlling the board, and communications ports 132 for electrically connecting ATE 116 to the board. In other embodiments of testing setup 100 of the present invention, the interface may be standalone device characterization board (not shown), e.g., a board similar to interface board 112, but not including the electronics and communications ports 132 needed for communicating with ATE 116. ATE 116, if present, may be a conventional ATE, e.g., a legacy ATE, or may be specially adapted for use with integrated testing system 108 of the present invention.

Testing setup 100 may optionally include a host computer 136 containing a user interface 140, e.g., a graphical user interface, operatively configured for programming and/or controlling the operation of integrated testing system 108. Host computer 136 may be integrated into integrated testing system 108 or may alternatively be located remotely from the integrated testing system, e.g., across one or more computer networks, such as a local area network (LAN) 144 and wide area network (WAN) 148, including the Internet. Implementation of user interface 140 could allow a user to operate integrated testing system 108 from virtually any suitable user device 152 from virtually any location. Implementation of user interface 140 is described below in more detail.

Figure 2:
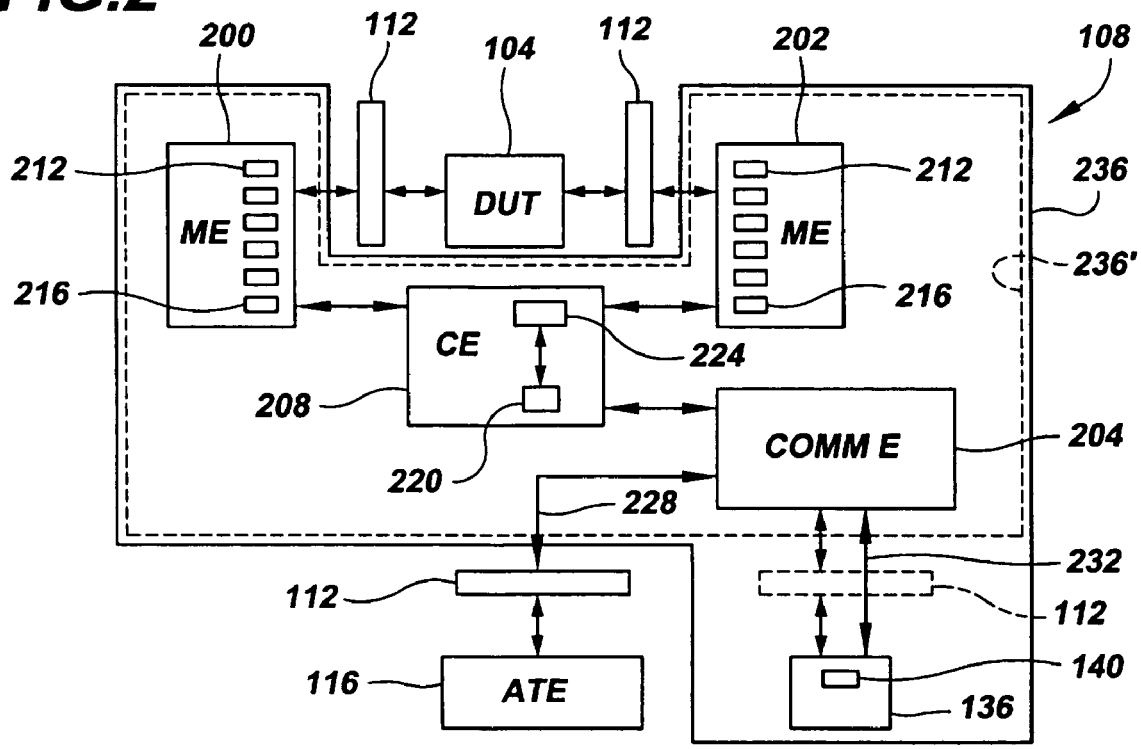
FIG. 2 is a high-level schematic diagram showing the integrated testing system of FIG. 1 in conjunction with automated testing equipment and a device-under test.

As shown in FIG. 2, integrated testing system 108 may comprise at least one measurement engine 200, 202, a communication engine 204 and a compute engine 208. Each of these components is described in much more detail below. However, as a general overview, each measurement engine 200 may include, among other things, testing instruments 212, 216 for electrically exciting, or stimulating, the circuitry being tested and for measuring the effect(s), or response(s), of the excitation on the circuitry. Communications engine 204 provides facilities for communicating with ATE 116 and/or user interface 140 for, among other things, controlling the operation of integrated testing system 108 and downloading test results and other data from the integrated testing system. Compute engine 208 may provide a variety of functions, such as controlling measurement engine(s) 200, 202 and communications engine 204 and processing raw measurement data into useful results.

At a high level, important features of integrated testing system 108 include, among others: 1) its ability to be configured to process measurement data "on-the-fly," i.e., while one or more measurement engines are proceeding with testing; 2) its ability to be configured to interface with a wide variety of ATE 116, including legacy and conventional ATE; and 3) its ability to be configured to interface with dedicated user interface 140 outside the context of ATE. As discussed below, each measurement engine 200, 202, communications engine 204 and compute engine 208 may be implemented using various hardware and software schemes.

In general, primary tasks of measurement engines 200, 202 include providing stimulus (or stimuli) to DUT 104 and measuring the DUT's response(s) to that stimulus (stimuli). Both of these functions may performed via an interface, e.g., interface board 112, that provides one or more electrical communications pathways (not shown) between DUT 104 and measurement engines 200, 202. To perform their respective functions, each measurement engine 200, 202 may comprise one or more stimulus instruments 212 for providing a corresponding number of stimulus signals to DUT 104. As discussed below, stimulus instruments 212 may be controlled separately or in one or more groups and in seriatim or in parallel to provide the desired stimulus (stimuli) to DUT 104, depending upon the nature of the testing being performed. Similarly, measurement engine 200, 202 may additionally or alternatively include one or more measurement instruments 216 for measuring the response(s) of DUT 104 to the one or more stimulus signals. Similar to stimulus instruments 212, measurement instruments 216 may be controlled separately or in one or more groups and in seriatim or in parallel to measure the desired response(s) of DUT 104, again depending upon the nature of the testing being performed.

In addition, depending on the nature of the testing, the number of measurement instruments 216 may or may not be the same as the number of stimulus instruments 212. For example, when testing an 8:1 serializer, measurement engine 200 may utilize eight stimulus instruments 212, i.e., one for each of the eight parallel inputs, and only one measurement instrument 216 for measuring the response signal of the serializer on its single serial output. Conversely, when testing a 1:8 deserializer, measurement engine 202 may utilize only one stimulus instrument 212 for exciting the serial input of the deserializer and eight measurement instruments 216 for measuring the deserializer's response on the eight parallel outputs. Of course, measurement engines 200, 202 may have greater than the number of stimulus instruments and/or measurement instruments needed for a particular test. This may be the case when a "general purpose" or highly flexible version of integrated testing system 108 is used for testing circuitry having fewer inputs and/or outputs than the number of stimulus and measurement instruments 212, 216 aboard the integrated testing system. In such cases, integrated testing system 108 can be controlled in a manner that only those of instruments 212, 216 needed for a particular test are utilized.

Stimulus measurement instruments 212 may be implemented using any suitable hardware or hardware/software scheme. For example, the present inventors have found that certain types of stimulus instruments 212, e.g., arbitrary waveform generators (AWGs) and timing generation units (TGUs), among others, and certain types of measurement instruments 216, Vernier delay lines and digitizers (DIGs), are effectively implemented in custom microcircuitry, e.g., application specific integrated circuits (ASICs). Implementing such instruments 212, 216 in discrete custom circuitry can provide a good compromise in size, cost and performance. Of course, even these instruments may be implemented in other ways, if desired, such as off-the-shelf circuitry or programmable or reprogrammable logic devices (PLDs or RLDs), among others. Those skilled in the art will readily appreciate the variety of ways stimulus and measurement instruments 212, 216 may be implemented, such that neither an exhaustive list nor detailed description of each is necessary for an appreciation of the broad scope of the present invention and to enable skilled artisans to make and use the present invention to its fullest scope.

Compute engine 208 may be configured to function as a central processor and central controller of integrated testing system 108. That is, compute engine 208 may be utilized, among other things, to: 1) setup and control the operation of stimulus instruments 212; 2) process and/or provide input, e.g., stimulus parameters, to the stimulus instruments; 3) initialize and control the operation of measurement instruments 216; 4) receive output, e.g., digital measurement data, from the measurement engines and process this output into desired results; 5) provide digital input directly to DUT 104; 6) initialize, communicate with and control communications engine 204; 7) perform self-testing; and 8) configure any RLDs utilized in integrated testing system 108, e.g., in the measurement engines or the compute engine itself. Of course, compute engine 208 need not provide all of this functionality if a certain implementation of integrated testing system 108 does not require it. In such cases, only the functionality(ies) desired for that implementation need be provided to integrated testing system 108.

Compute engine 208 may be implemented in any suitable hardware or hardware/software scheme, including, but not limited to, single and multiple chip solutions. Exemplary implementations include full digital signal processor (DSP) implementations, RLD implementations using, e.g., one or more field programmable gate arrays (FPGAs), and implementations comprising both DSP and RLD components, among others. Utilizing RLD technology for compute engine 208 can provide a flexible solution, particularly when it is desirable to customize integrated testing system 108 to each of a variety of testing applications, while enjoying the economies of manufacturing generic hardware. As those skilled in the art will appreciate, any portion(s) of measurement engines 200, 202, e.g., measurement instruments 216, and any portion(s) of compute engine 208, e.g., computation logic 800A–F (FIG. 8), may be implemented together in a single PLD or RLD, e.g., an FPGA. Then, defining measurement engines 200, 202 and compute engine 208 is partly a matter of partitioning a shared device, e.g., an FPGA, by functionality rather than defining the engines by discrete devices. In one embodiment, compute engine 208 may include an RLD 220 and a microcontroller 224 operatively connected to the RLD. One function of microcontroller 224 would be to program (and reprogram, if desired) RLD 220 to suit a particular application. The functioning of microcontroller 224 in this respect in connection with an overall control/programming scheme of integrated testing system 108 is described in more detail below.

For certain applications of integrated testing system 108, e.g., the testing of high-speed SerDes circuitry, among many others, the speed of the system is paramount. The integration of compute engine 208 into integrated test system 108 allows testing and processing speeds to be readily optimized and maximized, if needed, due to the close physical proximity of the compute engine to measurement engine(s) 200, 202 and DUT 104. This close physical proximity, or coupling, allows signal propagation delays between compute engine 208 and measurement engine(s) 200, 202 to be minimized. For example, compute engine 208 is preferably, but not necessarily within about 6 inches (15.24 cm), more preferably about 3 inches (7.62 cm) of each measurement engine 200, 202, and even closer spacing may be advantageous. In addition, with the ability, discussed below, of compute engine 208 to process measurement data on-the-fly, data storage requirements and processing delays associated therewith are minimized. Therefore, integrated testing system 108 is not only amenable to high-speed testing, but also minimizes overall test time, which includes the time needed to process raw measurement data into desired results.

As mentioned above, communications engine 204 provides integrated testing system 108 with an ATE communications link 228 for communicating with ATE 116, and/or a user-interface communications link 232 for communicating with user interface 140 supported by host computer 136. ATE communications link 228, if provided, may be established on any one or more of the channels, parallel or serial, that link interface board 112, e.g., a DIB, to ATE 116. Generally, integrated testing system 108 may be configured to appear to ATE 116 as a DUT. Such a configuration can be exploited to allow the integrated testing system 108 to interface with ATE 116 via the ATE's serial channels conventionally used to write and read digital data vectors to a DUT during conventional ATE testing. Many types of legacy and conventional ATE equipment include such serial channels. This interface to ATE 116 can allow for initializing, setting up, controlling, programming (including (re)programming RLD 220, if present) and reading and displaying, or otherwise presenting, output from integrated testing system 108. A benefit to this interface is that manufacturers of conventional and legacy ATE would not have to divulge any proprietary software to a manufacturer of integrated testing system 108 that might want the ATE manufacturers to provide their ATE with custom user interfaces. Of course, in alternative embodiments ATE 116 can be provided with custom interfaces for interfacing the ATE with integrated testing system 108. An example of a programming/control interface compatible with utilizing data vector channels of ATE 116 is presented below in connection with FIG. 8.

User-interface communications link 232, if provided, allows integrated testing system 108 to communicate with user interface 140 using any one of a number of communications protocols, such as an Ethernet protocol, among many others. User interface 140 may be implemented on host computer 136 in any suitable manner, such as in a platform-independent programming environment, e.g., the JAVA® programming environment developed by Sun Microsystems, Santa Clara, Calif. In this example, host computer 136 could be a network server, such as a Web server, or the like. In an embodiment in which host computer 136 includes a Web server, user interface 140 could be accessible via a Web browser from a user device 152 (FIG. 1), e.g., computer, workstation, Web appliance or any of a variety of thin clients, e.g., Web-enabled personal digital assistants and cell phones, among others. Like the interface (not shown) provided in connection with ATE communications link 228, user interface 140 could be operatively configured to provide a host of functionalities, including setting up, initializing, controlling, programming (including (re)programming RLD 220, if present) and reading and displaying, or otherwise presenting, output from integrated testing system 108, as needed to suit a particular application. Those skilled in the art will readily understand how to implement user interface 140 using conventional programming techniques once features of integrated testing system 108 have been selected. As mentioned above, host computer 136, and therefore user interface 140, may reside virtually anywhere relative to integrated testing system 108, including onboard a module 236, 236' containing one or more other components of the integrated testing system. The difference between module 236 and module 236' is that module 236 includes host computer 136, whereas module 236' does not. This difference generally leads to differences in connectivity between communications engine 204 and host computer 136. As used herein and in the appended claims, the term "module" is intended to include not only package-type modules, but also structures in which components are substantially fixed relative to one another, including, among others, boards containing components, e.g., packaged chips, engaged therewith, and groupings of packaged chips that, e.g., "plug in" to one another, and even single SOC-type chips.

Figure 3:
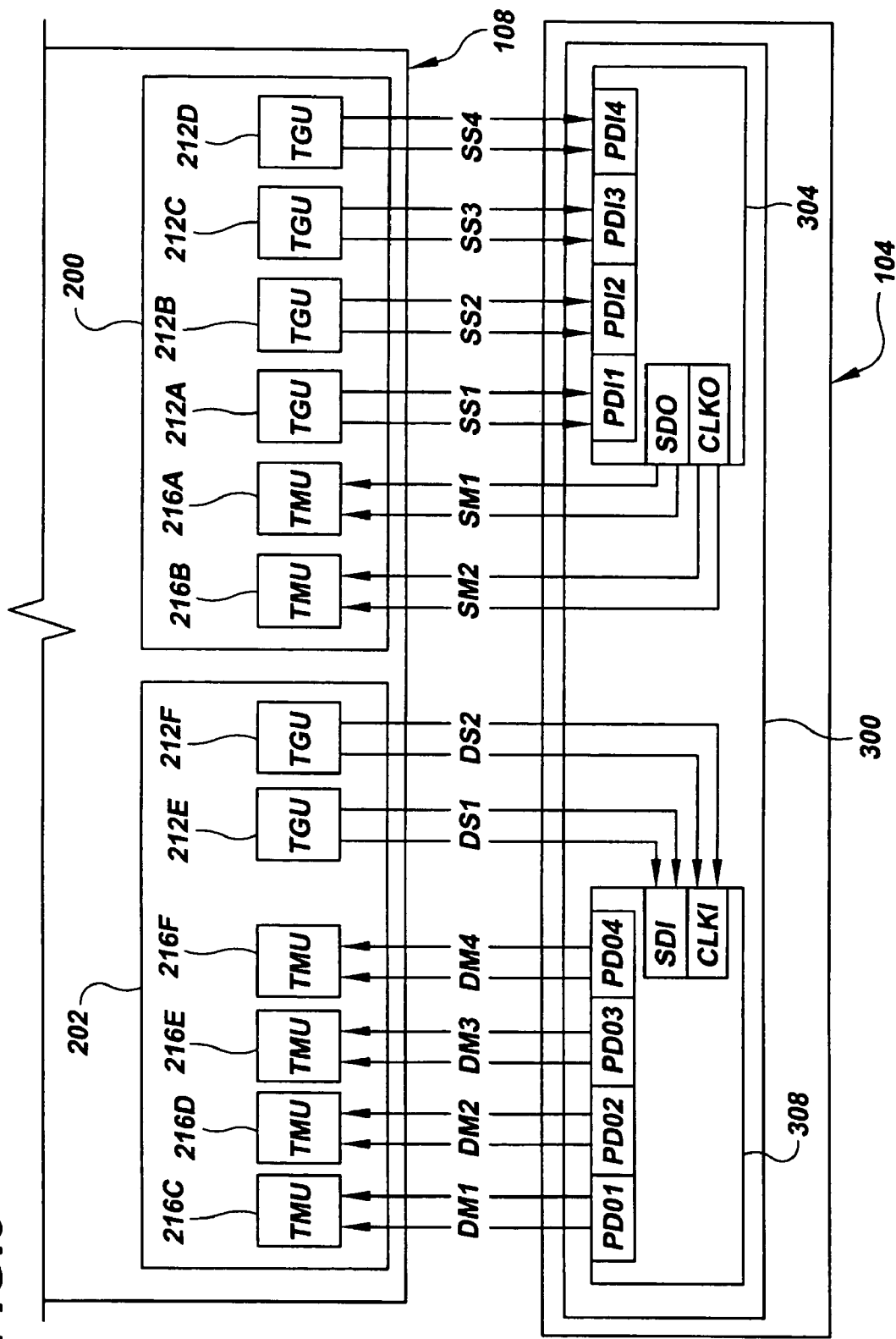
FIG. 3 is a high-level schematic diagram of the measurement engines of integrated testing system of FIG. 2 and serializer/deserializer circuitry of the device under test of FIG. 2 illustrating the signal path connectivity therebetween.

Referring to FIG. 3, testing setup 100 of FIG. 1 and various high-level features of integrated testing system 108 are described in detail in connection with jitter testing of a device (which becomes DUT 104 during testing) that includes SerDes circuitry 300. Although SerDes circuitry 300 provides a purely digital function, i.e., transforming parallel digital data into a serial bit stream, and vice versa, it behaves in an analog-like manner, particularly in the low voltage differential signaling technology typically used at gigabit-per-second (GBPS) speeds. Jitter measurement has been found to be an important factor in SerDes testing for measuring a bit error rate (BER) of the SerDes circuitry. The BER is the most important figure of merit for SerDes circuitry. Again, it is emphasized that this example is presented to illustrate testing setup 100 (FIG. 1) and, more particularly, integrated testing system 108 relative to a concrete and presently timely application. As those skilled in the art will readily appreciate, however, integrated testing system 108 is by no means limited to jitter testing of SerDes circuitry 300. On the contrary, any one or more of the high-level features and concepts of the present invention may be implemented in virtually any sort of circuit testing application.

As is well-known in the art, SerDes circuitry, such as SerDes circuitry 300, may be used to send and receive parallel data over one or more serial links in a wide variety of applications, such as data communication applications complying with any one or more of a large array of communication standards. These standards include chip-to-chip and board-to-board standards, such as XAUI, and long-distance telecommunication standards, such as SONET. Presently, SerDes circuitry is being designed to operate in a GBPS regime and will likely operate faster in the future. Conventional ATE, standing alone, are often unsuitable for testing GBPS SerDes devices due to their internal clocks being too slow to test these devices at their rated speeds.

In FIG. 3, SerDes circuitry 300 is shown as comprising a 4:1 serializer 304 and a 1:4 deserializer 308. Of course, SerDes circuitry 300 may be any n:m serializer and m:n deserializer, depending on its application. Four parallel channels and one serial channel have been selected for simplifying the explanation of measurement engines 200, 202. Upon reading the following description of measurement engines 202, 204, those skilled in the art will readily understand the modifications of these engines necessary to test SerDes circuitry having other numbers of parallel and serial channels. Being a 4:1 device, serializer 304 has four parallel data inputs PDI1, PDI2, PDI3, PDI4, a high-speed serial data output SDO and a high-speed clock output ClkO. Similarly, 1:4 deserializer 308 has a high-speed serial data input SDI, a high-speed clock input ClkI and four parallel data outputs PDO1, PDO2, PDO3, POD4. Of course, as those skilled in the art will appreciate, SerDes circuitry 300 can include other components, such as a low speed clock (not shown) operating at a frequency related to the parallel output data rate from parallel data outputs PDO1, PDO2, PDO3, PDO4 of deserializer 308.

In order to perform jitter testing of serializer 304 and deserializer 308, integrated testing system 108 may include two measurement engines, measurement engine 200 for testing the serializer and measurement engine 202 for testing deserializer 308. Measurement engine 200 may include four stimulus instruments 212A, 212B, 212C, 212D providing four independent channels SS1, SS2, SS3, SS4 of stimulus ("SS" denoting "serializer stimulus"), each for stimulating a corresponding one of parallel data inputs PDI1, PDI2, PDI3, PDI4. In the context of the jitter testing example being described, each stimulus instrument 212A–D is conveniently called "test generation unit" or "TGU" for short. An exemplary embodiment of each TGU 212A–D is described below in connection with FIG. 4. TGUs 212A–D may use any suitable signaling technology appropriate for test. In the present case of parallel data inputs PDI1, PDI2, PDI3, PDI4, low voltage differential signaling (LVDS) may be used. On the measurement side, measurement engine 200 may include two measurement instruments 216A, 216B, conveniently called "test measurement units," or "TMUs" for short, in the context of the subject jitter test. TMUs 216A–B provide two separate channels SM1, SM2 ("SM" denoting "serializer measurement") for receiving signals, respectively, from serial data output SDO and a high-speed clock output ClkO of serializer 304. Like TGUs 212A–D, TMUs 216A–B may use any suitable signaling technology, such as current mode logic (CML) signaling.

Similarly, for deserializer 308, measurement engine 202 may include two TGUs 212E, 212F providing two independent stimulus channels DS1, DS2 ("DS" denoting "deserializer stimulus"), each for stimulating a corresponding one of serial data input SDI and clock input ClkI. Like TGUs 212A–D, TGUs 212E–F may use any suitable signaling technology appropriate for the test, such as CML. On the measurement side, measurement engine 202 may include four TMUs 216C, 216D, 216E, 216F that provide four separate channels DM1, DM2, DM3, DM4 ("DM" denoting "deserializer measurement") for receiving signals, respectively, from parallel data outputs PDO1, PDO2, PDO3, PDO4. Like TMUs 216A–B, TMUs 216C–F may use any suitable signaling technology appropriate for the test, such as LVDS. If deserializer 308 includes the slow clock (not shown) mentioned above, measurement engine 202 may include an additional TMU (not shown) for measuring the output of this clock. Although integrated testing system 108 has been described as comprising two measurement engines 200, 202, those skilled in the art will readily appreciate that all of TGUs 212A–F and TMUs 216A–F may be contained in a single measurement engine or, alternatively, arranged so as to provide more than two measurement engines. An extreme example would be the case in which each of TMUs 216A14 F and TGUs 212A–F is considered to be in its own measurement engine.

Figure 4:
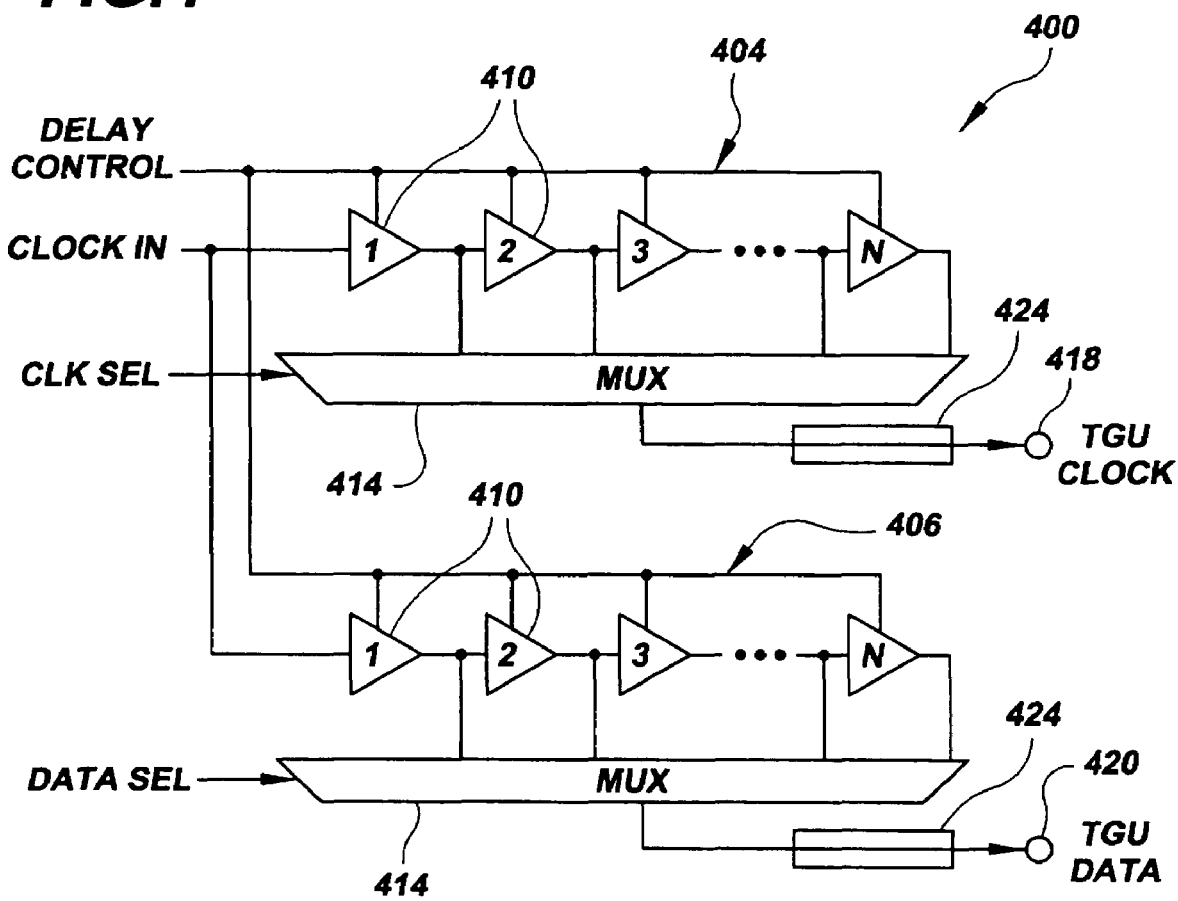
FIG. 4 is a schematic diagram of a timing generation unit and driving circuit suitable for use in any one or more of the stimulus instruments of FIG. 3.
Figure 5:
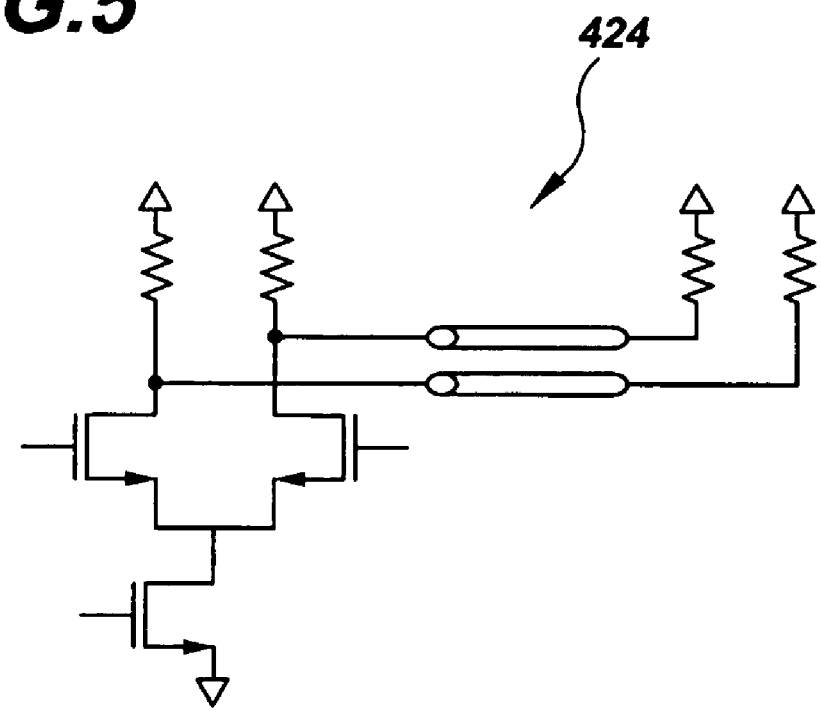
FIG. 5 is a schematic diagram of a DC driving circuit suitable for use in the timing generation unit of FIG. 4.
Figure 6:
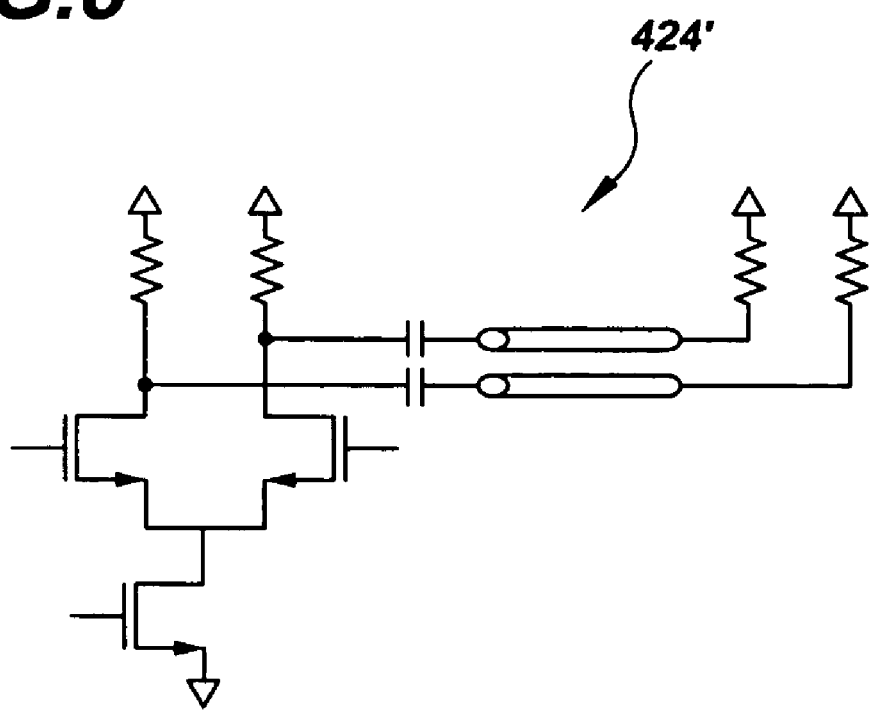
FIG. 6 is a schematic diagram of an AC driving circuit suitable for use in the timing generation unit of FIG. 4.

Each TGU 212A–F may comprise a linear programmable delay circuit such as circuit 400 as shown in FIG. 4. Circuit 400 may include two delay lines 404, 406 made from a cascade of programmable delay elements 410 and a selecting device 414 to provide a variable delay on two separate output pins 418, 420. Each delay line 404, 406 may include any number N of delay elements 410, e.g., 16, so that the multiplexing logic of selecting device 414 may implement simple N:1 decoding. Consequently, selecting device 414 may be a selector or a multiplexer, i.e., selector and decoder, that allows selection of any of the N delay settings by a corresponding n-bit control vector. For example, with 16 delay elements 410, the selection vector may be a 4-bit control vector having 16 possible values corresponding to the 16 possible delay settings. Due to the reliance on integration, selecting device 414 and delay elements 410 can be made extremely small and logic operations in the hundreds of MHz is easily achieved. Excellent linearity can be achieved by using proper layout averaging techniques and robustly tunable delay elements for elements 414. The inventors have found that 3 picosecond delay steps can be achieved by vernier delay generation circuit 400. Circuit 400 may further include driving circuitry 424 to drive the corresponding stimulus signals to DUT 104. FIG. 5 illustrates driving circuitry 424 suitable for DC coupling to DUT 104. FIG. 6 illustrates driving circuitry 424' suitable for AC coupling to DUT 104.

Figure 7:
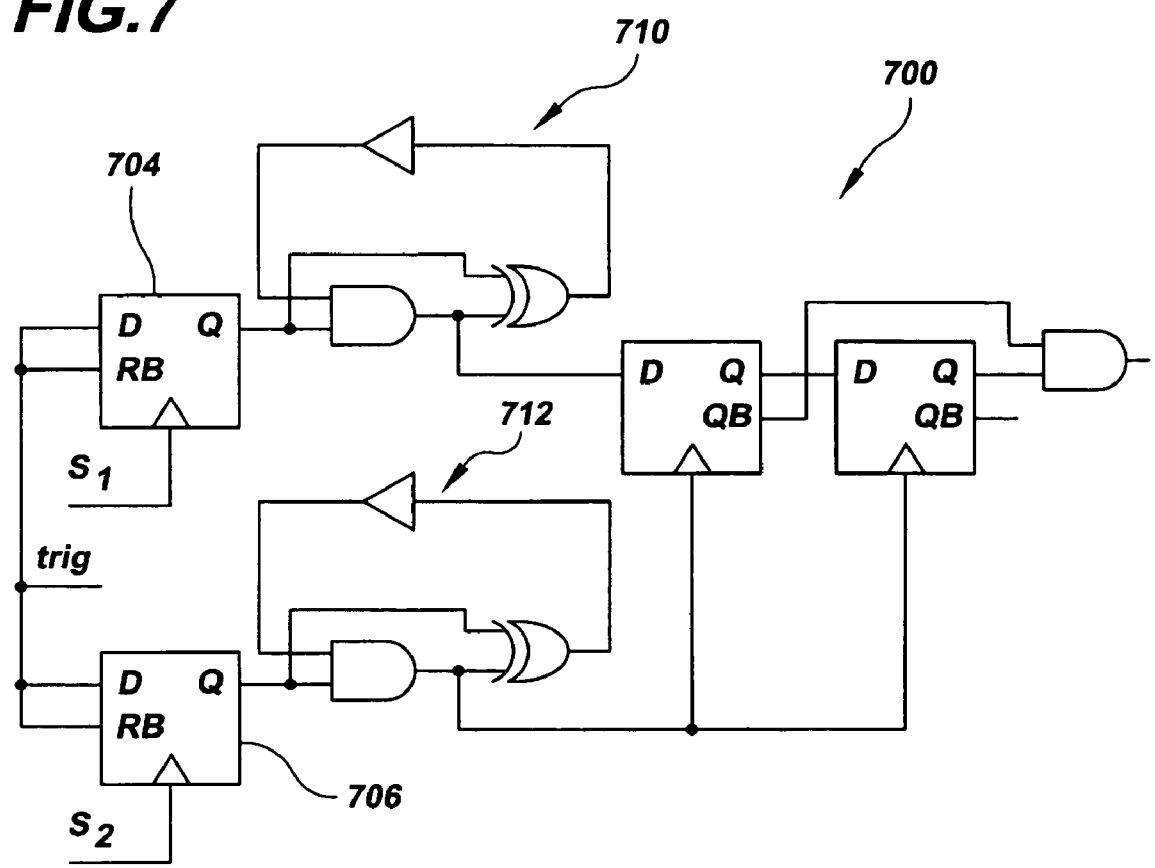
FIG. 7 is a schematic diagram of a timing measurement unit suitable for use in any one or more of the measurement instruments of FIG. 4.

Referring to FIG. 7, and also to FIG. 3, each TMU 216A–F may include a component-invariant vernier delay line circuit 700. Circuit 700 is shown and described in great detail in U.S. Patent Application Publication No. 20030006750, entitled "Timing Measurement Device Using A Component-Invariant Vernier Delay Line," published Jan. 9, 2003 in the names of Roberts et al., which is incorporated by reference herein in its entirety. Generally, however, circuit 700 measures the phase relationship between two input signals $s_1$, $s_2$, e.g., one of data output signals SDO, PDO 1–4 and one of output clock signal ClkO of FIG. 3 or an internal time-based signal (not shown). Circuit 700 generally includes a pair of input flip-flops 704, 706 for receiving corresponding ones of input signals $s_1$, $s_2$. Flip-flops 704, 706 communicate with respective oscillators 710, 712 having oscillation frequencies slightly different from one another. In order to initiate a measurement, a trigger or arm command Trig is applied to input flip-flops 704, 706 of circuit 700. This enables each flip-flop 704, 706 to detect the first incoming edge of respective input signals $s_1$, $s_2$. Once an edge arrives, each flip-flop 704, 706 starts corresponding respective oscillator 710, 712.

Because of the offset-frequency relationship between oscillators 710, 712, their respective phases will eventually align. A simple evaluation of the time it takes oscillators 710, 712 to phase align yields an accurate representation of the original phase difference between the edges of input signals $s_1$, $s_2$ detected at the inputs of flip-flops 704, 706, respectively. A benefit of circuit 700 is its compactness and its inherent linearity over a large measurement range. For example, the present inventors have found that with a 2.0 nanosecond range and a 25 picosecond step size, the non-linearity is less than 0.5 LSB. Circuit 700 shown in the '750 publication mentioned above is generally intended for use within a DUT. However, to execute this circuit outside a DUT, additional low noise receiver circuits (not shown) it will typically be necessary to sense the correct timing information related to the signals in question. Those skilled in the art will understand how to implement such low noise circuits.

Figure 8:
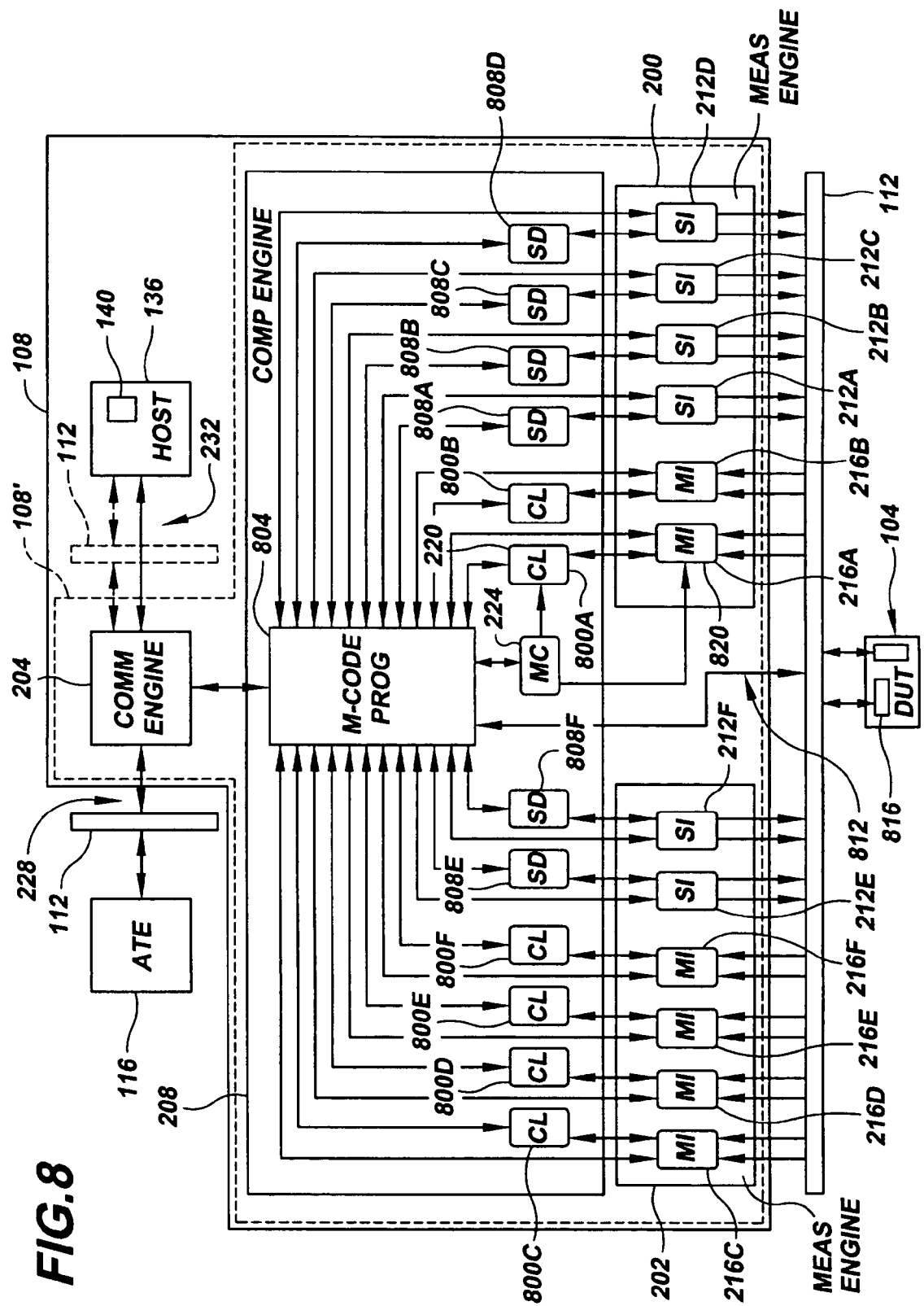
FIG. 8 is a high-level schematic diagram of integrated testing system of FIG. 2 illustrating signal path connectivity among the various components thereof with automated testing equipment, a device-under-test and a user interface residing on a host computer.

In the context of the present jitter testing scenario, the output from any of TMUs 216A–F containing component-invariant vernier delay circuit 700 represents phase relationships of input signals $s_1$, $s_2$. Consequently, various algorithms for computing typical jitter performance parameters, e.g., root-mean-square (RMS), peak-to-peak, mean and median parameters, among others, may be implemented in compute engine 208, e.g., in custom computation logic circuitry 800A–F, as shown in FIG. 8.

For example, a peak-to-peak measurement for which the computation is $$J=\max(X[n])-\min(X[n]) \text{ for } n=1 \ldots N \quad \{1\}$$

can be computed on-the-fly by using a pair of registers and a comparator (not shown). If compute engine 208 comprises RLD 220 as discussed above, these registers and comparator may be implemented in the RLD. Similarly, a moving average filter can be expressed recursively as $$\text{Average}[n]=\text{Average}[n-1]+X[n] \quad \{2\}$$

which may be implemented in hardware as an accumulator (not shown). It is important to note that the moving average filter just discussed is just one example of a filter that could be implemented recursively. As those skilled in the art will appreciate, many others exist.

As yet another example, it is noted that RMS jitter is related to the autocorrelation function of an input sequence at a lag of zero. Consequently, RMS jitter may be expressed recursively as $$R[0]=\text{Sum } X[n]X[-n] \quad \{3\}$$

which is simply a convolution summation of the incoming TMU measurements. A common feature of these examples is that compute engine 208 could complete the necessary computations in little or no time in addition to the time it takes for the samples to be acquired via a sample cycle of corresponding respective ones of TGUs 212A–F and TMUs 216A–F. The inventors have experienced sample acquisition rates of 2 Msamples/sec/channel. Consequently, collecting thousands of samples and computing their jitter statistics could be performed in a few milliseconds.

Other algorithms involving fast Fourier transforms (FFT) and discrete Fourier transforms can also be implemented in an on-the-fly manner. Such transforms enable more sophisticated signal processing operations to be performed on the measurement data, such as auto-correlation and cross-correlation operations. Those skilled in the art will also appreciate that other transforms and methods, including wavelet transform methods, may be implemented for separating measurement signals from noise. Skilled artisans will further appreciate that since the measurements are processed locally in pipeline fashion, the present invention may identify failed parts sooner than the prior art approach of taking all the measurements, storing all the measurements and transferring all the measurements to ATE 116 prior to processing the results.

Although measurement engines 200, 202 and compute engine 208 have just been described in detail in connection with jitter testing of SerDes circuitry 300 for convenience of illustrating various features of these components of integrated testing system 108, as mentioned above the present invention is by no means limited to jitter testing or SerDes testing. Rather, various aspects of the present invention may be implemented across a wide variety of testing types and tested-circuitry types. For example, each measurement engine 200, 202 may include in addition to, or in place of, TGUs 212A–F and TMUs 216A–F, one or more other types of stimulus and measurement instruments (not shown), such as AWGs, DIGs, precision measurement units (used to measure a resulting voltage when a specified current is forced into a circuit node and parametric measurement units used to measure a resulting current when a specified voltage is forced across a pair of circuit nodes, among others. AWGs, DIGs and PMUs can be particularly useful in conducting mixed signal testing.

One example of mixed signal testing utilizing AWGs and DIGs, albeit in the context of embedded core testing, is discussed in U.S. Patent Application Publication No. 20020019962 entitled "Integrated Excitation/Extraction System For Test And Measurement," published Feb. 14, 2002 in the names of Roberts et al., which is incorporated by reference herein in its entirety. Although the AWGs, DIGs and associated testing scheme described in the '675 application are described in the context of embedded core testing, the general concepts and circuits described in that application are applicable to implementing a similar mixed signal testing scheme in the context of integrated testing system 108 of the present invention. Those skilled in the art will understand the modifications to the AWGs, DIGs and testing scheme of the '675 application needed to implement them externally relative to a DUT, such as DUT 104 of FIGS. 1–3, e.g., via external test pins.

FIG. 8 illustrates a control/programming scheme that may be used to control integrated testing system 108. Central to this scheme is a micro-code based processor 804 that contains appropriate microcode for performing the necessary functions for carrying out the desired testing. Such functions include: initializing and testing various components of integrated testing system 108; e.g., stimulus and measurement instruments 212A–F, 216A–F, computation logic circuits 800A–F and one or more stimulus drivers 808A–F, among others; starting and stopping the stimulus instruments and handling communications tasks with communications engine 204 and/or with ATE 116 or host computer 136 through the communication engine; controlling the loading of stimulus patterns into the stimulus instruments; and controlling the operation of computation logic circuits; and communicating with microcontroller 224 to (re)program any PLDs or RLDs 220, if any, included in compute engine 208 and/or measurement engines 200, 202, among other things. It is not practical, nor necessary to discuss in any great detail the various micro-code instructions that processor 804 may utilize to perform these tasks. This is so because skilled artisans would readily know how to implement an appropriate micro-code scheme knowing all of the functions that must be performed in a particular design of integrated testing system 108.

In order to make integrated testing system 108 more easily programmed by a user, e.g., a test engineer, processor 804 may optionally utilize a set of operation codes, commonly called "opcodes," that obviate the need for a user to generate programs in micro-code. Opcodes in general are well-known in the art. Relative to integrated testing system 108, those skilled in the art would certainly be able to develop and utilize an appropriate set of opcodes that efficiently utilize the micro-code of processor 804 to perform the necessary functions. However, for the sake of illustration, each opcode may be implemented in a short word, i.e., two bytes, in which the bits are assigned as shown in Table 1.

TABLE 1

| Bit(s) | Content | Description |
| --- | --- | --- |
| 7:0 | Argument | The argument is typically a component register's address. |
| 11:8 | Op-Code | The action to be performed |
| 12 | Free | |
| 14:13 | Burst Length | The number of DATA words to follow CONTROL word in the program that must get written to sequential component address. Or the number of sequential component address that must be read and stored to sequential SRAM address. This is used to speed up the loading of large vectors and also the recovery of many results, i.e. to avoid a Control/Data - Control/Data fixed pattern and waisted bus cycles. |
| 15 | Inc | Used in conjunction with burst length to set if the component address counter gets incremented (1) or not at each bus cycle. |

Again, for the sake of illustration, exemplary opcodes that may be implemented in integrated testing system 108 of the present invention appear in Table 2.

TABLE 2

| Code | Name | Description |
| --- | --- | --- |
| 0001 | WRI | Write the following DATA word(s) to component [argument] |
| 0010 | CONDH | Hold program until the first bit of component [argument] is true |
| 0011 | STOP | Stop the program |
| 0100 | STOR | Store the content of component [argument] to SRAM[Base + MEMPT + DATA] |
| 0101 | LD | Load SRAM[Base + MEMPT + DATA] into component [argument] |
| 0110 | JMP | Jump the program to PGM[DATA] |
| 0111 | LOOPS | Sets loop counter to DATA |
| 1000 | LOOPC | Checks loop counter, if 0 then jump the program to PGM[DATA] otherwise substract 1 from loop counter. |
| 1001 | MEMPTS | Set Memory pointer, MEMPT, to data (Reset is 0) |
| 1010 | MEMPTI | Increase Memory pointer by 1 (For use in loops) |
| 1011 | CONDJ | Check first bit of component [argument], if true jump to PGM[DATA] |
| 1100 | | FREE |
| 1101 | | FREE |
| 1110 | | FREE |
| 1111 | | FREE |

The opcodes may be used to create programs for conducting tests and performing various other tasks, such as calibrating stimulus and measurement instruments 212A–F, 216A–F. Each program may have any suitable format. For the sake of illustration, each program may consist of a plurality of lines, e.g., however many lines needed for the particular task(s) to be performed, each line consisting of a short word. Depending upon the program, configuration of integrated testing system 108, and/or the functions of the various opcodes, among other things, some or all of the lines may be opcodes. The short words of the lines not containing opcodes may contain, e.g., input data for a set of stimulus drivers 808A–F, if used, or stimulus instruments 212A–F. A simple ten-line program for loading stimulus data to memories (not shown) of stimulus instruments 212A–F is illustrated in Table 3.

TABLE 3

| Line | Code/Data |
| --- | --- |
| 1 | OPCODE |
| 2 | OPCODE |
| 3 | OPCODE |
| 4 | OPCODE |
| 5 | OPCODE |
| 6 | WRI-68 |
| 7 | XXXXXXXXXXXXXXXX |
| ... | ... |
| n − 1 | XXXXXXXXXXXXXXXX |
| n | STOP |

In Table 3, lines 1–5 include opcodes, e.g., for initializing stimulus and/or measurement instruments 212A–F, 216A–F, memory and state. Line 6 contains the opcode for writing the stimulus data and lines 7–9 contain corresponding short words of the stimulus data to be written to the memory. Line 10 contains the opcode for ending the program. Although not shown, a higher-level programming language, e.g., an assembly language, may be implemented to further simplify the programming process. Such a language could express opcodes in more convenient terms and/or contain functions that each execute multiple opcodes. Those skilled in the art will readily understand how to implement a higher-level language suitable for a particular application.

As mentioned, compute engine 208 may optionally include stimulus drivers 808A–F that communicate with corresponding ones of stimulus instruments 212A–F to load the stimulus instruments with the proper stimulus parameters desired for a particular test. Each stimulus 808A–F driver may comprise a memory (not shown) that stores a number of sets of stimulus parameters. Consequently, when stimulus instruments 212A–F are being set up for a particular test, one or more setup instructions placed in the opcode program may direct stimulus drivers 808A–F to load the corresponding respective stimulus instruments 212A–F with the desired set of stimulus parameters. If stimulus drivers 808A–F are not provided, stimulus parameters may be passed directly to stimulus instruments 212A–F from processor 804 as described above in connection with Table 3.

Briefly mentioned above is the fact that compute engine 208 may optionally be provided with one or more digital links 812 for connecting it directly to DUT 104 via an interface, e.g., interface board 112. In this manner, digital circuitry 816 aboard DUT 104 may be tested using conventional digital testing techniques. Since such techniques are well known in the art, it is not necessary to list them or describe them herein for those skilled in the art to understand how to make and use the present invention to its fullest scope. Like measurement data from measurement instruments 216A–F, the digital testing response of DUT 104 may be analyzed by compute engine 208 or passed out of integrated testing system 108 via an interface, such as interface board 112, e.g., to ATE 116 or user interface 140 for analysis. If the digital testing response is analyzed by compute engine 208, the compute engine may send only a pass/fail flag or analysis summary out of integrated testing system 108.

When AWGs, DIGs and/or PMUs are used, stimulus drivers 808A–F and computation logic circuits 800A–F would need to be augmented or replaced in order to provide the proper stimulus input and algorithms necessary to support these instruments. Of course, those skilled in the art will appreciate that the stimulus drivers 808A–F and computation logic 800A–F for supporting these instruments will be application specific and that it is neither practical nor necessary to exhaustively list and describe all possible alternative for those skilled in the art to understand how to implement the present invention in these and other applications.

As mentioned above, if any one or more of compute engine 208 and measurement engines 200, 202 includes a PLD or an RLD such as RLD 220 and RLD 820, processor 804 may communicate with microcontroller 224 for the purpose of (re)programming each PLD or RLD as needed. Again, depending upon the design of integrated testing system 108, various components of compute engine 208, e.g., computation logic circuits 800A–F and stimulus drivers 808A–F, and measurement engines 200, 202, e.g., stimulus and measurement instruments 212A–F, 216A–F, may be prime candidates implementing as PLDs or RLDs, since these components are most likely to require customization or modification when adapting the integrated testing system from one type of testing and/or tested device to another. This programming may be done via any programming scheme, e.g., via the opcode/micro-code scheme discussed above. This programming scheme may be implemented via ATE communications link 228, e.g., utilizing serial ATE data vector channels or via user-interface communications link 232. In the case of an opcode programming scheme, the corresponding program would include the appropriate opcodes for communicating with and/or controlling microcontroller 224, identifying the appropriate PLD(s) and/or RLD(s) 220, 820 and providing the microcontroller with the appropriate data for (re)configuring each PLD or RLD. Given a particular type of PLD or RLD, those skilled in the art will readily understand how to (re)configure PLD or RLD 220, 820 via processor 804 and microcontroller 224, such that further explanation is not necessary herein.

Figure 9:
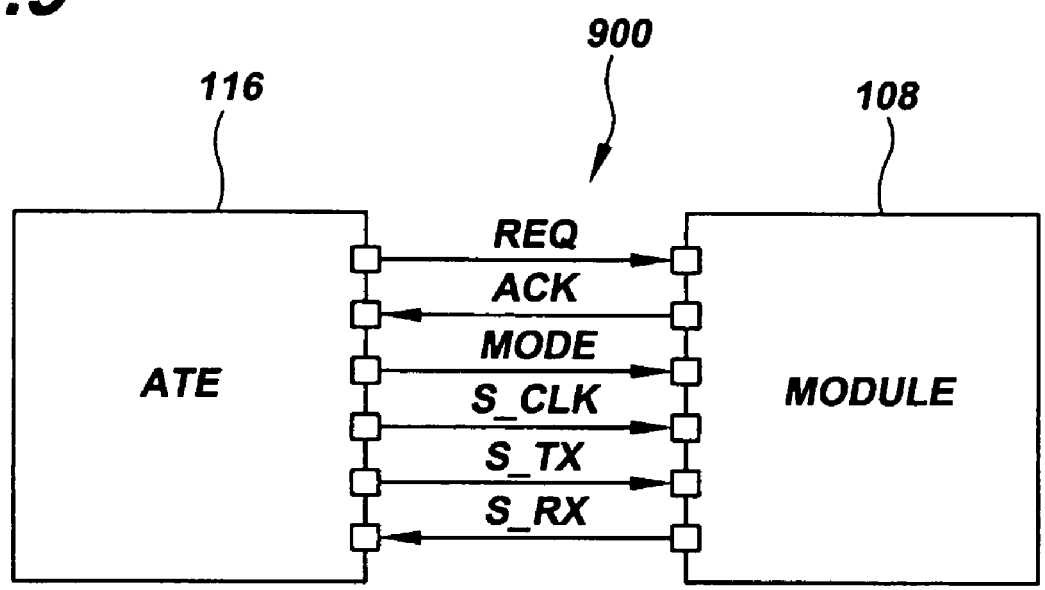
FIG. 9 is a high-level schematic diagram illustrating a serial connectivity scheme between the integrated testing system of FIG. 2 and ATE.

As mentioned above, in one embodiment integrated testing system 108 may be set up and controlled using serial channels of ATE 116 typically used for downloading data vectors to DUT 104. Referring to FIG. 9, and also to FIG. 8, FIG. 9 shows an exemplary implementation of such a serial communications link 900 (i.e., ATE communications link 228 of FIG. 8) between ATE 116 and integrated testing system 108, wherein the communications link is connected to the channel cards of the ATE. In this manner, from a testing program point of view, integrated testing system 108 appears to be just another DUT. However, unlike a DUT, the reserved pins implement a simple serial bus protocol for passing commands and data from ATE 116 to integrated testing system 108 using a simple testing program, e.g., the program discussed above in connection with the opcode programming scheme. For example, serial communications link 900 can be used, e.g., to pass stimulus parameters to stimulus instruments 212A–F (or, alternatively, to stimulus drivers 808A–F, which in turn load the stimulus instruments), to set pass-fail test limits for localized processing of measurement data or to globally interrupt the operation of integrated testing system 108, in addition to the other functions discussed above.

Serial communications link 900 may utilize any number of channels compatible with the corresponding ATE. For example, communications link may include six channels denoted REQ (request), ACK (acknowledge), MODE (nature of the request), S_CLK (communications clock), S_TX (transmit channel) and S_RX (receive channel). The MODE channel is used by the master to signal to the slave what it is that is being requested (e.g., a file upload, download, test execution, test abort, etc.). The S_CLK is driven by the master in order to stream data out on the S_TX channel or to stream data in on the S_RX line.

An important goal of utilizing serial communications link 900, when provided, is to provide a means for implementing high-level, minimally interactive control of integrated testing system 108 using ATE 116. Thus, although communications link 900 may be relatively slow, the fact that interaction between ATE 116 and integrated testing system 108 is minimal, the slow speed is essentially of no consequence, since most, or all, of the analysis of measurement data may be performed by compute engine 208 aboard the integrated testing system. For example, if desired, ATE 116 may be used to set up a sequence of tests and to pass test parameters to integrated testing system 108 only once in order for the integrated testing system to test multiple DUTs 104 of the same type. In addition, it may not be necessary to upload test results from integrated testing system 108 to ATE 116, unless a user would desire this. Instead, result comparison may be performed locally within integrated testing system 108.

Figure 10:
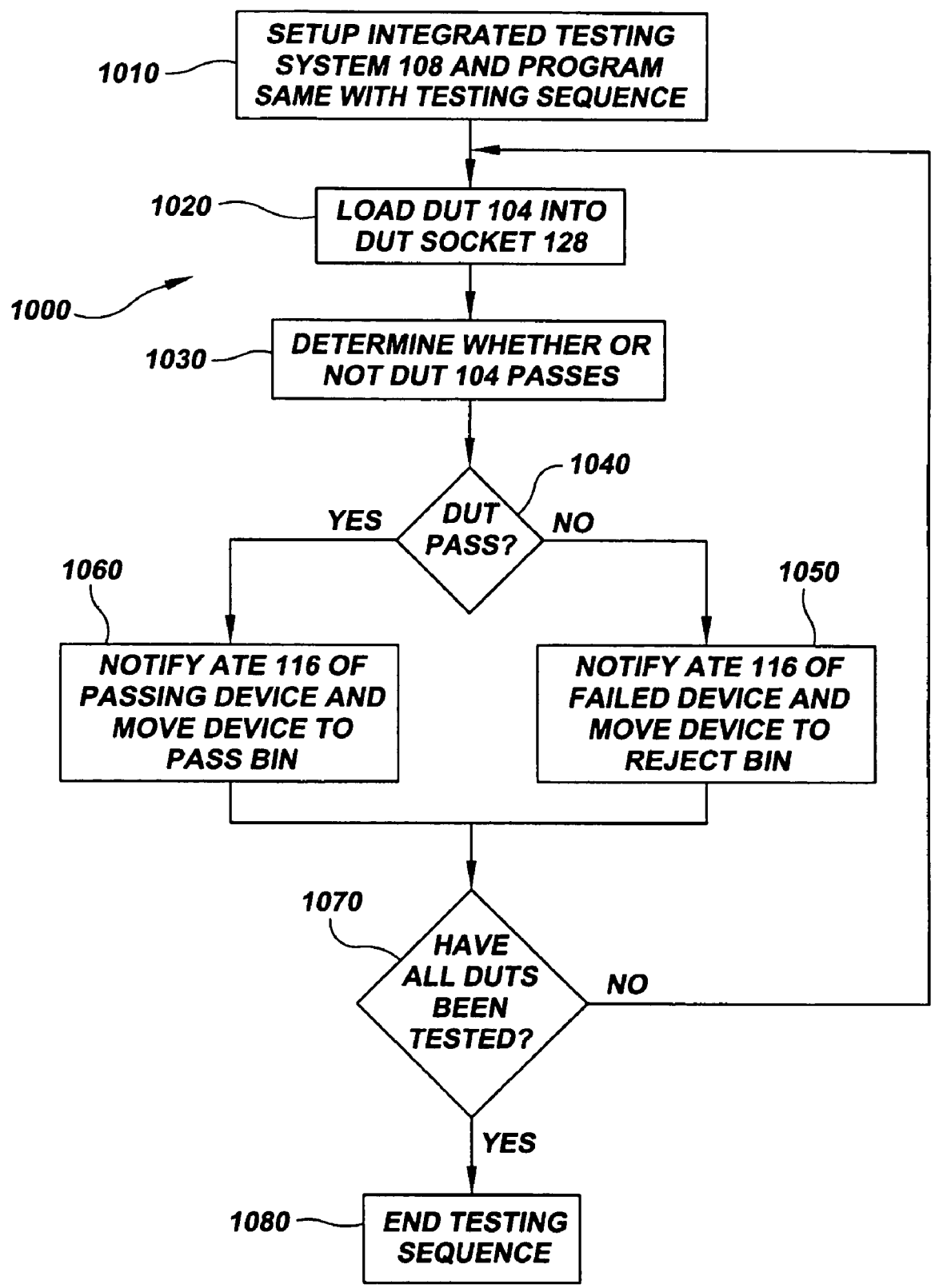
FIG. 10 is a flow diagram illustrating a process for testing one or more devices-under-test using an integrated testing system of the present invention.

In one embodiment, a testing process 1000 may proceed as shown in FIG. 10. Referring to FIG. 10, and also to FIGS. 1 and 2, testing process 1000 may begin at step 1010 with ATE downloading one or more setup/testing programs to integrated testing system 108, e.g., using an opcode-based program as discussed above in connection with FIG. 8. Once compute engine 208 has executed the setup/testing program (s) so as to ready integrated testing system 108 for proceeding with the desired testing, at step 1020, ATE 116 may load DUT 104 into DUT socket 128 of interface board 112, e.g., a DIB. After DUT 104 has been loaded, ATE 116 may trigger testing of the DUT. At step 1030, integrated testing system 108 determines whether or not DUT 104 passes or fails the test. Step 1030 may occur either after testing has been completed or during testing as soon as one or more response signals from DUT 104 are not within acceptable limits. As discussed above, integrated testing system 108 may perform computations on measurement data on-the-fly, i.e., while stimulus instruments 212 and measurement instruments 216 are testing DUT 104.

Depending upon the nature of the computations performed, one or more out-of-limit responses of DUT 104 may almost immediately allow integrated testing system 108 to determine that the DUT fails the test. In this case, at step 1050 integrated testing system 108 may discontinue testing and notify ATE 116 that DUT 104 should be rejected. At step 1050, ATE 116 may also move the rejected device to a "reject" bin (not shown). However, if integrated testing system 108 determines DUT 104 passes the test, at step 1060 it may notify ATE 116 of this so that the ATE may move the passing part to a "pass" bin (not shown). In an alternative embodiment (not shown), ATE 116 may make the pass/fail determination for a particular DUT 104, rather than integrated testing system 108. In this case, measurement data may be read back to ATE 116 via ATE communications interface 228, e.g., serial communications link 900 of FIG. 9. ATE 116 would of course contain the appropriate facilities for making the pass/fail determination based on the data received from integrated testing system.

At optional step 1070, integrated testing system may determine if all DUTs in the group to be tested have been tested, e.g., by comparing a count of DUTs tested to a previously input total of DUTs to be tested during this cycle. If not, process 1000 may loop back to step 1020, at which point another DUT 104 may be loaded into DUT socket 120 and tested. If step 1070 determined that all DUTs to be tested have been tested, process 1000 may end at step 1080. Alternatively, testing process 1000 may be globally interrupted by ATE 116. If another one or more of the same type of DUT are to be tested after process 1000 has stopped or been stopped, testing may be resumed with or without repeating step 1010. However, if another type of test is to be performed and/or another type of DUT is to be tested, step 1010 will have to be repeated using one or more new setup/testing programs suited to the particular test and/or device type. Of course, as those skilled in the art will readily understand, any of a number of testing processes may be implemented depending upon the design or application of integrated testing system 108. In addition, although testing has been illustrated relative to implementation via ATE 116, testing may alternatively be implemented via user interface 140 in a similar or different manner.

Referring to FIG. 8, integrated testing system 108 has been described above as generally comprising one or more measurement engines 200, 202, a compute engine 208 and a communications engine 204, each of which has been described and shown as comprising certain components, e.g., stimulus instruments 212A–F, measurement instruments 216A–F, stimulus drivers 808A–F, computation logic circuits 800A–F, a micro-code processor 804, etc. It is noted, however, that the partitioning of measurement engines 200, 202, compute engine 208 and communications engine 204 need not be as shown. For example, instead of stimulus drivers 808A–F being designated as part of compute engine 208, the stimulus drivers may be part of measurement engines 200, 202. Similarly, computation logic circuits 800A–F may be part of measurement engines 200, 202 instead of compute engine 208, if desired. Those skilled in the art will appreciate the variations of components that may be assigned among measurement engine(s) 200, 202, compute engine 208 and communications engine 204.

Although the invention has been described and illustrated with respect to exemplary embodiments thereof, it should be understood by those skilled in the art that the foregoing and various other changes, omissions and additions may be made therein and thereto, without parting from the spirit and scope of the present invention.

What is claimed is:

1. An integrated testing system for testing circuitry of a device under test (DUT) via an interface board having a first socket for receiving the integrated testing system and a second socket for receiving the DUT, the integrated testing system comprising:
a module operatively configured to engage the first socket of the interface board and including:
a) at least one measurement engine operatively configured to electrically excite the circuitry with at least one analog stimulus signal, measure at least one analog response of the circuitry to said at least one analog stimulus test signal and generate measurement data when the integrated testing system is engaged with the first socket and the DUT is engaged with the second socket; and b) a compute engine operatively configured to perform at least one computation on said measurement data, said compute engine comprising a micro-code processor operatively configured to execute one or more programs that control said at least one measurement engine and said compute engine so that the integrated testing system performs the testing.

2. An integrated testing system according to claim 1, wherein said compute engine is operatively configured to determine whether the DUT passes or fails.

3. An integrated testing system according to claim 1, wherein said at least one measurement engine comprises a plurality of analog stimulus instruments each operatively configured to provide a corresponding analog stimulus signal to the DUT.

4. An integrated testing system according to claim 1, wherein said at least one measurement engine comprises a plurality of measurement engines each operatively configured to measure a corresponding response signal output by the DUT.

5. An integrated testing system according to claim 1, wherein said at least one measurement engine includes at least one reprogrammable logic device (RLD) and said compute engine contains a microcontroller operatively configured to program said at least one RLD.

6. An integrated testing system according to claim 1, wherein said compute engine includes at least one RLD and a microcontroller operatively configured to program said at least one RLD.

7. An integrated testing system according to claim 1, further comprising a communications engine aboard said module and operatively coupled with said compute engine.

8. An integrated testing system according to claim 7, wherein said communications engine is operatively configured to facilitate communications between automated testing equipment (ATE) and said compute engine.

9. An integrated testing system according to claim 8, wherein the ATE includes a data vector communications link and said communications engine is operatively configured to communicate over the data vector communications link.

10. An integrated testing system according to claim 7, wherein said compute engine is operatively configured to receive instructions via said communications link for conducting testing.

11. An integrated testing system according to claim 7, wherein the integrated testing system is controllable via a non-automated testing equipment (non-ATE) user interface and said communications engine is operatively configured to facilitate communications between the non-ATE user interface and said compute engine.

12. An integrated testing system according to claim 1, wherein said compute engine is operatively configured to perform computations on said measurement data substantially in parallel with said at least one measurement engine measuring the response of the circuitry of the DUT.

13. An integrated testing system according to claim 1, further comprising at least one digital link operatively configured to permit said compute engine to communicate digital data to the DUT when the DUT is engaged with the second socket of the interface board.

14. An integrated testing system for testing circuitry of a device under test (DUT) via an interface board having a first socket for receiving the integrated testing system and a second socket for receiving the DUT, the integrated testing system comprising:

a module operatively configured to engage the first socket of the interface board and including:

a) at least one measurement engine operatively configured to electrically excite the circuitry with at least one analog stimulus signal, measure at least one analog response of the circuitry to said at least one analog stimulus signal and generate measurement data when the integrated testing system is engaged with the first socket and the DUT is engaged with the second socket;

b) a compute engine operatively configured to perform at least one computation on said measurement data, said compute engine comprising a micro-code processor operatively configured to execute one or more programs that control said at least one measurement engine and said compute engine so that the integrated testing system performs the testing; and e) a communications engine operatively configured to establish a two-way communications link between said compute engine and at least one device.

15. A testing module according to claim 14, wherein the at least one device is a piece of automated testing equipment (ATE).

16. An integrated testing system according to claim 14, wherein the at least one device is a host computer containing a user interface for the integrated testing system.

17. An integrated testing system according to claim 16, wherein said host computer is aboard said module.

18. An integrated testing system according to claim 14, comprising a plurality of measurement engines each operatively configured to provide said at least one analog stimulus signal to the circuitry and to generate measurement data that is a function of at least one response of the circuitry to said at least one stimulus signal.

19. An integrated testing system according to claim 18, wherein said compute engine is operatively configured to permit a user to select which one or more of said plurality of measurement engines to use during testing.

20. An integrated testing system according to claim 14, wherein said at least one measurement engine comprises a plurality of stimulus instruments.

21. An integrated testing system according to claim 20, wherein said compute engine is operatively configured to permit a user to select which one or more of said plurality of stimulus instruments to use during testing.

22. An integrated testing system according to claim 14, wherein said at least one measurement engine comprises a plurality of measurement instruments.

23. An integrated testing system according to claim 22, wherein said compute engine is operatively configured to permit a user to select which one or more of said plurality of stimulus measurement instruments to use during testing.

24. An integrated testing system according to claim 14, wherein said compute engine is operatively configured to process said measurement data into a result, said communications engine operatively configured to communicate said result to the at least one device.

25. An integrated testing system according to claim 24, wherein said result is a pass/fail indication.

26. An integrated testing system according to claim 24, wherein the at least one device is a piece of automated testing equipment (ATE).

27. An integrated testing system according to claim 26, wherein the piece of ATE includes a serial communication link and said communications engine is operatively configured to communicate said results over said serial communications link.

28. An integrated testing system according to claim 24, wherein the device is a host computer containing a non-automated testing equipment (non-ATE) user interface for the integrated testing system.

29. An integrated testing system according to claim 28, wherein said communications engine includes a high-speed communications link to the non-ATE user interface.

30. An integrated testing system according to claim 14, wherein said communications engine is operatively configured for communicating with both an automated testing equipment (ATE) and a non-ATE user interface.

31. An integrated testing system according to claim 14, further comprising a host computer containing a user interface for controlling the integrated testing system.

32. An integrated testing system according to claim 31, wherein said host computer comprises a network server operatively configured to connect to a network of computers.

33. An integrated testing system according to claim 32, wherein said network server is a Web server.

34. An integrated testing system according to claim 14, wherein at least one of said compute engine and said at least one measurement engine includes at least one reprogrammable logic device (RLD) and said compute engine is operatively configured to program said at least one RLD via said communications engine.

35. A testing module according to claim 14, wherein said compute engine is operatively configured to generate a plurality of test results substantially in parallel with said at least one measurement engine generating said measurement data.

36. An integrated testing system according to claim 14, wherein said at least one measurement engine comprises at least one arbitrary waveform generator generating said at least one analog stimulus signal.

37. An integrated testing system according to claim 14, wherein said at least one measurement engine comprises at least one timing generation unit generating said at least one analog stimulus signal.

38. An integrated testing system according to claim 14, wherein said at least one measurement engine comprises at least one vernier delay line for measuring said at least one analog response of the circuitry.

39. An integrated testing system according to claim 14, wherein said at least one measurement engine comprises at least one digitizer for digitizing said at least one analog response of the circuitry.

40. A system for performing a test on a device under test (DUT), the system comprising:
  a) a testing module that includes:
    i) at least one measurement engine operatively configured to provide at least one analog stimulus signal to the DUT and to generate measurement data that is a function of at least one analog response of the DUT to said at least one analog stimulus signal, said at least one measurement engine comprising an arbitrary waveform generator for generating said at least one analog signal or a timing generation unit for generating said at least one analog signal or both of said arbitrary waveform generator and said timing generation unit; and
    ii) a compute engine in communication with said at least one measurement engine and operatively configured to generate at least one test result as a function of said measurement data; and
  b) an interface operatively configured to establish electrical communications between said testing module and the DUT, said interface including:
    i) a first socket operatively configured to receive the DUT; and
    ii) a second socket receiving said testing module.

41. A system according to claim 40, wherein said interface is an interface board operatively configured to interface with automated testing equipment (ATE) over a communications link.

42. A system according to claim 41, wherein said testing module further comprises a communications engine operatively configured to transmit said at least one test result to the ATE.

43. A system according to claim 41, wherein said communications link is a serial link.

44. A system according to claim 40, wherein said testing module further comprises a communications engine operatively configured to communicate said at least one test result to a non-automated testing equipment (non-ATE) user interface.

45. A system according to claim 44, wherein said communications engine includes a high-speed communications link to the non-ATE user interface.

46. A system according to claim 40, wherein said compute engine is operatively configured to provide digital data to the DUT when the DUT is engaged with said first socket.

47. A system according to claim 40, wherein said compute engine is operatively configured to generate a plurality of test results substantially in parallel with said at least one measurement engine generating said measurement data.

48. A system according to claim 40, wherein said at least one measurement engine comprises at least one vernier delay line for measuring said at least one analog response of the DUT.

49. A system according to claim 40, wherein said at least one measurement engine comprises at least one digitizer for digitizing said at least one analog response of the DUT.

50. An integrated testing system for testing circuitry of a device under test (DUT) via an interface board having a first socket for receiving the integrated testing system and a second socket for receiving the DUT, the integrated testing system comprising:
  a module operatively configured to engage the first socket of the interface board and including:
    a) at least one measurement engine operatively configured to electrically excite the circuitry with at least one analog stimulus signal, measure at least one analog response of the circuitry to said at least one analog stimulus test signal and generate measurement data when the integrated testing system is engaged with the first socket and the DUT is engaged with the second socket; and
    b) a compute engine operatively configured to perform at least one computation on said measurement data,
  wherein said at least one measurement engine comprises at least one arbitrary waveform generator generating said at least one analog stimulus signal.

51. An integrated testing system according to claim 50, wherein said at least one measurement engine comprises at least one timing generation unit generating said at least one analog stimulus signal.

52. An integrated testing system according to claim 50 wherein said at least one measurement engine comprises at least one vernier delay line for measuring said at least one analog response of the circuitry.

53. An integrated testing system according to claim 50 wherein said at least one measurement engine comprises at least one digitizer for digitizing said at least one analog response of the circuitry.

54. An integrated testing system for testing circuitry of a device under test (DUT) via an interface board having a first socket for receiving the integrated testing system and a second socket for receiving the DUT, the integrated testing system comprising:
 a) a module operatively configured to engage the first socket of the interface board and including:
  i) at least one measurement engine operatively configured to electrically excite the circuitry with at least one analog stimulus signal, measure at least one analog response of the circuitry to said at least one analog stimulus test signal and generate measurement data when the integrated testing system is engaged with the first socket and the DUT is engaged with the second socket; and
  ii) a compute engine operatively configured to perform at least one computation on said measurement data; and
 b) a host computer containing a user interface operatively configured to control the integrated testing system.

55. An integrated testing system according to claim 54, wherein said host computer comprises a network server operatively configured to connect to a network of computers.

56. An integrated testing system according to claim 55, wherein said network server is a Web server.

57. An integrated testing system for testing circuitry of a device under test (DUT) via an interface board having a first socket for receiving the integrated testing system and a second socket for receiving the DUT, the integrated testing system comprising:
 a module operatively configured to engage the first socket of the interface board and including:
  a) at least one measurement engine operatively configured to electrically excite the circuitry with at least one analog stimulus signal, measure at least one analog response of the circuitry to said at least one analog stimulus test signal and generate measurement data when the integrated testing system is engaged with the first socket and the DUT is engaged with the second socket;
  b) a compute engine operatively configured to perform at least one computation on said measurement data; and
  c) a communications engine operatively coupled with said compute engine;
 wherein the integrated testing system is controllable via a non-automated testing equipment (non-ATE) user interface and said communications engine is operatively configured to facilitate communications between the non-ATE user interface and said compute engine.

58. An integrated testing system for testing circuitry of a device under test (DUT) via an interface board having a first socket for receiving the integrated testing system and a second socket for receiving the DUT, the integrated testing system comprising:
 a module operatively configured to engage the first socket of the interface board and including:
  a) at least one measurement engine operatively configured to electrically excite the circuitry with at least one analog stimulus signal, measure at least one analog response of the circuitry to said at least one analog stimulus test signal and generate measurement data when the integrated testing system is engaged with the first socket and the DUT is engaged with the second socket;
  b) a compute engine operatively configured to perform at least one computation on said measurement data; and
  c) a communications engine aboard said module and operatively coupled with said compute engine;
 wherein at least one of said compute engine and said at least one measurement engine includes a reprogrammable logic device (RLD) and said compute engine is operatively configured to receive instructions via said communications engine for programming said RLD.

* * * * *